United States Patent
Park et al.

(10) Patent No.: US 10,202,525 B2
(45) Date of Patent: Feb. 12, 2019

(54) PRESSURE SENSITIVE ADHESIVE COMPOSITION, PRESSURE SENSITIVE ADHESIVE FILM, AND METHOD OF MANUFACTURING ORGANIC ELECTRONIC DEVICE USING THE SAME

(71) Applicant: LG CHEM, LTD., Seoul (KR)

(72) Inventors: Sang Min Park, Daejeon (KR); Yoon Gyung Cho, Daejeon (KR); Kyung Yul Bae, Daejeon (KR); Hyun Jee Yoo, Daejeon (KR); Jung Sup Shim, Daejeon (KR); Min Soo Park, Daejeon (KR)

(73) Assignee: LG Chem, Ltd., Seoul (KR)

( * ) Notice: Subject to any disclaimer, the term of this patent is extended or adjusted under 35 U.S.C. 154(b) by 505 days.

(21) Appl. No.: 14/647,365

(22) PCT Filed: Aug. 5, 2014

(86) PCT No.: PCT/KR2014/007244
§ 371 (c)(1),
(2) Date: May 26, 2015

(87) PCT Pub. No.: WO2015/020413
PCT Pub. Date: Feb. 12, 2015

(65) Prior Publication Data
US 2015/0299523 A1   Oct. 22, 2015

(30) Foreign Application Priority Data

Aug. 5, 2013 (KR) .................. 10-2013-0092782
Apr. 4, 2014 (KR) .................. 10-2014-0040816

(51) Int. Cl.
| | |
|---|---|
| *H01L 51/00* | (2006.01) |
| *C09J 109/00* | (2006.01) |
| *H01L 51/56* | (2006.01) |
| *H01L 51/52* | (2006.01) |
| *C09J 9/00* | (2006.01) |
| *C09J 4/00* | (2006.01) |
| *C09J 7/00* | (2018.01) |
| *C09J 123/22* | (2006.01) |
| *C09J 133/08* | (2006.01) |
| *C09J 145/00* | (2006.01) |
| *C09J 7/20* | (2018.01) |
| *C09J 7/10* | (2018.01) |

(52) U.S. Cl.
CPC ............ *C09J 109/00* (2013.01); *C09J 4/00* (2013.01); *C09J 7/00* (2013.01); *C09J 7/10* (2018.01); *C09J 7/20* (2018.01); *C09J 9/00* (2013.01); *C09J 123/22* (2013.01); *C09J 133/08* (2013.01); *C09J 145/00* (2013.01); *H01L 51/0001* (2013.01); *H01L 51/004* (2013.01); *H01L 51/0026* (2013.01); *H01L 51/0043* (2013.01); *H01L 51/0094* (2013.01); *H01L 51/5237* (2013.01); *H01L 51/5246* (2013.01); *H01L 51/5253* (2013.01); *H01L 51/5256* (2013.01); *H01L 51/5259* (2013.01); *H01L 51/56* (2013.01); *C09J 2201/36* (2013.01); *C09J 2201/606* (2013.01); *C09J 2203/326* (2013.01); *C09J 2205/114* (2013.01); *C09J 2409/00* (2013.01); *C09J 2415/003* (2013.01); *C09J 2423/00* (2013.01); *C09J 2423/003* (2013.01); *C09J 2433/003* (2013.01); *Y10T 428/2883* (2015.01)

(58) Field of Classification Search
None
See application file for complete search history.

(56) References Cited

U.S. PATENT DOCUMENTS

| | | | | |
|---|---|---|---|---|
| 6,093,757 | A  * | 7/2000 | Pern ................. | B32B 17/10678 |
| | | | | 136/251 |
| 8,232,350 | B2 | 7/2012 | Fujita et al. | |
| 2003/0130427 | A1* | 7/2003 | Cleary ................ | A61K 9/7053 |
| | | | | 525/192 |
| 2005/0121665 | A1* | 6/2005 | Gillissen ............ | C08F 290/067 |
| | | | | 257/40 |
| 2009/0026934 | A1 | 1/2009 | Fujita et al. | |
| 2010/0155247 | A1* | 6/2010 | Cao ..................... | C08L 21/00 |
| | | | | 204/600 |
| 2011/0030756 | A1* | 2/2011 | Honda ................. | C09J 7/021 |
| | | | | 136/244 |
| 2011/0105637 | A1* | 5/2011 | Fujita ................... | C08L 23/22 |
| | | | | 522/120 |
| 2014/0217621 | A1* | 8/2014 | Yoo ..................... | B32B 3/04 |
| | | | | 257/788 |
| 2014/0319497 | A1 | 10/2014 | Cho et al. | |
| 2014/0322526 | A1* | 10/2014 | Dollase .................. | C03C 27/10 |
| | | | | 428/337 |
| 2015/0329747 | A1* | 11/2015 | Cho ....................... | C09J 7/00 |
| | | | | 257/40 |

(Continued)

FOREIGN PATENT DOCUMENTS

| | | |
|---|---|---|
| CN | 101151343 A | 3/2008 |
| CN | 102083930 A | 6/2011 |

(Continued)

OTHER PUBLICATIONS

"Oppanol PIB by BASF", product brochure by BASF, retrived Feb. 26, 2018.*

*Primary Examiner* — Anish P Desai
(74) *Attorney, Agent, or Firm* — Dentons US LLP

(57) ABSTRACT

Provided are a pressure-sensitive adhesive composition, a pressure-sensitive adhesive film, and a method of manufacturing an organic electronic device using the same. The pressure-sensitive adhesive composition that may effectively prevent moisture or oxygen added to an organic electronic device from an external environment, and exhibit reliability under harsh conditions such as high temperature and high humidity and excellent optical characteristics, and a pressure-sensitive adhesive film including the same are provided.

13 Claims, 1 Drawing Sheet

(56) References Cited

U.S. PATENT DOCUMENTS

| | | | |
|---|---|---|---|
| 2016/0100299 A1* | 4/2016 | Nawrocki | G06Q 30/018 455/414.1 |
| 2017/0044405 A1* | 2/2017 | Yoo | B32B 7/12 |

FOREIGN PATENT DOCUMENTS

| | | | | |
|---|---|---|---|---|
| EP | 1777237 A1 | 4/2007 | | |
| EP | 2610319 A1 | 7/2013 | | |
| JP | 60-92343 A | 5/1985 | | |
| JP | 02-170867 A | 7/1990 | | |
| JP | 2004-307579 A | 11/2004 | | |
| JP | 10-2006-0106721 A | 10/2006 | | |
| JP | 2009-524705 A | 7/2009 | | |
| JP | 2011-526629 A | 10/2011 | | |
| JP | 2013-120804 A | 12/2011 | | |
| KR | 10-2008-0088606 A | 10/2008 | | |
| KR | 10-2013-0081261 A | 7/2013 | | |
| TW | 201002796 A1 | 1/2010 | | |
| TW | 201329178 A | 7/2013 | | |
| WO | WO 2013057264 A1 * | 4/2013 | | C03C 27/10 |
| WO | 2013/073902 A1 | 5/2013 | | |
| WO | WO 2013103284 A1 * | 7/2013 | | B32B 3/04 |

* cited by examiner

PRESSURE SENSITIVE ADHESIVE COMPOSITION, PRESSURE SENSITIVE ADHESIVE FILM, AND METHOD OF MANUFACTURING ORGANIC ELECTRONIC DEVICE USING THE SAME

This application is a National Stage Entry of International Application No. PCT/KR2014/007244, filed on Aug. 5, 2014, and claims the benefit of Korean Application No. 10-2013-0092782, filed on Aug. 5, 2013, and Korean Application No. 10-2014-0040816, filed on Apr. 4, 2014, all of which are hereby incorporated by reference in their entirety.

BACKGROUND

1. Field of the Invention

The present invention relates to a pressure-sensitive adhesive composition, a pressure-sensitive adhesive film, and a method of manufacturing an organic electronic device using the same.

2. Discussion of Related Art

An organic electronic device (OED) refers to a device including an organic material layer generating alternation of charges using holes and electrons, and may include, for example, a photovoltaic device, a rectifier, a transmitter, and an organic light emitting diode (OLED).

A representative OED, which is an OLED, has less power consumption and a higher response speed, and forms a thinner display device or light than a conventional light source. In addition, the OLED has excellent space utilization, and is expected to be applied in various fields including all kinds of portable devices, monitors, notebook computers, and TVs.

To extend commercialization and use of the OLED, a major problem is durability. Organic materials and metal electrodes included in the OLED are very easily oxidized by external factors such as water, and a product including the OLED is very sensitive to environmental factors. Therefore, various methods to prevent penetration of oxygen or water from an external environment with respect to an organic electronic device such as the OLED have been suggested.

In Korean Unexamined Patent No. 2008-0088606, an adhesive capsulated composition film and an organic electroluminescence light emitting device are provided, and have poor processability as a pressure-sensitive adhesive based on polyisobutylene (PIB) and low reliability under conditions of high temperature and high humidity.

Accordingly, in an organic electronic device, it is required to develop an encapsulant ensuring a required lifetime, excellently preventing permeation of moisture, maintaining reliability under conditions of high temperature and high humidity, and having excellent optical characteristics.

SUMMARY OF THE INVENTION

The present invention is directed to providing a pressure-sensitive adhesive composition which can form a structure effectively preventing moisture or oxygen input to an organic electronic device from an external environment, and has excellent mechanical characteristics such as handleability and processability and excellent transparency, a pressure-sensitive adhesive film, and a method of manufacturing an organic electronic device using the same.

In one aspect, the present invention provides a pressure-sensitive adhesive composition. The pressure-sensitive adhesive composition may be applied to, for example, encapsulation or capsulation of an organic electronic device such as an OLED.

The term "organic electronic device" used herein refers to a product or device having a structure including an organic material layer generating alternation of charges using holes and electrons between a pair of electrodes facing each other, and may include, but is not limited to, for example, a photovoltaic device, a rectifier, a transmitter, and an organic light emitting diode (OLED). In one example, the organic electronic device may be an OLED.

In an exemplary embodiment of the present invention, the pressure-sensitive adhesive composition may include an encapsulating resin including a copolymer of a diene and an olefin-based compound having one carbon-carbon double bond, and a multifunctional active energy ray-polymerizable compound that can be polymerized by irradiation of an active energy ray. The active energy ray-polymerizable compound may satisfy Formula 1:

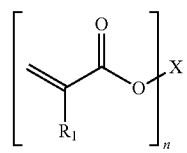

[Formula 1]

In Formula 1, $R_1$ is hydrogen or an alkyl group having 1 to 4 carbon atoms, n is an integer of 2 or more, and X is a residue induced from a linear, branched, or cyclic alkyl group having 3 to 30 carbon atoms.

In one example, the pressure-sensitive adhesive composition of the present invention may have an excellent light transmittance and a low haze when being prepared in a film. In one example, the pressure-sensitive adhesive composition may have a haze of 3%, 2.8%, 2.5%, 2.3%, 2.2%, or 2.0% or less when being prepared in a film. That is, the pressure-sensitive adhesive composition of the present invention may have a specific crosslinking structure, thereby exhibiting reliability under conditions of high temperature and high humidity, and may use an active energy ray-polymerizable compound having an excellent compatibility with the encapsulating resin and other additives to reduce a haze caused by a reaction, thereby exhibiting excellent optical characteristics.

In an exemplary embodiment of the present invention, the encapsulating resin may have a glass transition temperature of less than 0, −10, −30, −50, or −60° C. Here, the glass transition temperature may refer to a glass transition temperature after UV rays are irradiated at a dose of approximately 1 J/cm$^2$ or more, or a glass transition temperature after thermal curing is additionally performed after UV irradiation.

In one example, the encapsulating resin may include a styrene-based resin or an elastomer, a polyolefin-based resin or an elastomer, other elastomers, a polyoxyalkylene-based resin or an elastomer, a polyester-based resin or an elastomer, a polyvinylchloride-based resin or an elastomer, a polycarbonate-based resin or an elastomer, a polyphenylenesulfide-based resin or an elastomer, a mixture of hydrocarbon, a polyamide-based resin or an elastomer, an acrylate-based resin or an elastomer, an epoxy-based resin or an elastomer, a silicon-based resin or an elastomer, a fluorine-based resin or an elastomer, or a mixture thereof.

Here, the styrene-based resin or an elastomer may be, for example, a a styrene-ethylene-butadiene-styrene (SEBS) block copolymer, a styrene-isoprene-styrene (SIS) block copolymer, an acrylonitrile-butadiene-styrene (ABS) block copolymer, an acrylonitrile-styrene-acrylate (ASA) block copolymer, a styrene-butadiene-styrene (SBS) block copolymer, a styrene-based homopolymer, or a mixture thereof. The olefin-based resin or an elastomer may be, for example, a high density polyethylene-based resin or an elastomer, a low density polyethylene-based resin or an elastomer, a polypropylene-based resin or an elastomer, or a mixture thereof. The elastomer may be, for example, an ester-based thermoplastic elastomer, an olefin-based elastomer, a silicon-based elastomer, an acrylic elastomer, or a mixture thereof. Among these, the olefin-based thermoplastic elastomer may be a polybutadiene resin or an elastomer or a polyisobutylene resin or an elastomer. The polyoxyalkylene-based resin or an elastomer may be, for example, a polyoxymethylene-based resin or an elastomer, a polyoxyethylene-based resin or an elastomer, or a mixture thereof. The polyester-based resin or an elastomer may be, for example, a polyethylene terephthalate-based resin or an elastomer, a polybutylene terephthalate-based resin or an elastomer, or a mixture thereof. The polyvinylchloride-based resin or an elastomer may be, for example, polyvinylidene chloride. The mixture of hydrocarbon may be, for example, hexatriacontane or paraffin. The polyamide-based resin or an elastomer may be, for example, nylon. The acrylate-based resin or an elastomer may be, for example, polybutyl(meth)acrylate. The epoxy-based resin or an elastomer may be, for example, a bisphenol-type such as a bisphenol A-type, a bisphenol F-type, a bisphenol S-type, and a hydrogenated product thereof; a novolac-type such as a phenolnovolac-type or a cresolnovolac-type; a nitrogen-containing ring-type such as a triglycidylisocyanurate-type or a hydantoin-type; an alicyclic-type; an aliphatic-type; an aromatic-type such as a naphthalene-type or a biphenyl-type; a glycidyl-type such as a glycidylether-type, a glycidylamine-type, or a glycidylester-type; a dicyclo-type such as dicyclopentadiene-type; an ester-type; an etherester-type; or a mixture thereof. The silicon-based resin or an elastomer may be, for example, polydimethylsiloxane. In addition, the fluorine-based resin or an elastomer may be a polytrifluoroethylene resin or an elastomer, a polytetrafluoroethylene resin or an elastomer, a polychlorotrifluoroethylene resin or an elastomer, a polyhexafluoropropylene resin or an elastomer, polyvinylidene fluoride, polyvinyl fluoride, polyethylenepropylene fluoride, or a mixture thereof.

One of the above-listed resins or elastomers may be grafted to, for example, maleic anhydride, copolymerized with another one of the listed resins or elastomers or a monomer for preparing the resin or elastomer, or modified by a compound, other than the above-used resins or elastomers. The compound may be a carboxyl-terminated butadiene-acrylonitrile copolymer.

In one example, the pressure-sensitive adhesive composition is an encapsulating resin, which may include an olefin-based elastomer, a silicon-based elastomer, or an acrylic elastomer of the above-described types, but the present invention is not limited thereto.

Particularly, the encapsulating resin may be a copolymer of a diene and an olefin-based compound having one carbon-carbon double bond. Here, the olefin-based compound may include isobutylene, propylene, or ethylene, and the diene may be a monomer capable of being polymerized with the olefin-based compound, for example, 1-butene, 2-butene, isoprene, or butadiene. That is, the encapsulating resin of the present invention may be, for example, a homopolymer of an isobutylene monomer; a copolymer prepared by copolymerizing an isobutylene monomer with a monomer capable of being polymerized therewith; or a mixture thereof. In one example, the copolymer of the olefin-based compound having one carbon-carbon double bond and the diene may be a butyl rubber. When a specific resin is used as described above, moisture barrierability that would be achieved in the present invention may be satisfied. In addition, the present invention may improve humidity resistance and heat resistance by preparing a specific composition satisfying Equation 1 described above due to low heat resistance, while a conventional isobutylene polymer has low moisture permeability.

In the pressure-sensitive adhesive composition, the resin or elastomer component may have a weight average molecular weight (Mw) to an extent that the pressure-sensitive adhesive composition can be plasticized in a film type. For example, the resin or elastomer may have a weight average molecular weight (Mw) of approximately 100,000 to 2,000,000, 100,000 to 1,500,000, or 100,000 to 1,000,000. The term "weight average molecular weight" used herein refers to a converted value with respect to standard polystyrene measured by gel permeation chromatography (GPC). However, the resin or elastomer component does not necessarily have the above-mentioned weight average molecular weight. For example, when a molecular weight of the resin or elastomer component is not sufficient for forming a film, a separate binder resin may be blended in the pressure-sensitive adhesive composition.

The pressure-sensitive adhesive composition of the present invention may include, as described above, an active energy ray-polymerizable compound, which has a high compatibility with the encapsulating resin, and form a specific crosslinking structure along with the encapsulating resin. That is, the active energy ray-polymerizable compound satisfying Formula 1 may particularly have an excellent compatibility with the encapsulating resin of the present invention, and thus satisfy an optical characteristic and reliability at high temperature and high humidity. For example, the active energy ray-polymerizable compound may realize a pressure-sensitive adhesive composition having an excellent moisture barrierability, high reliability at high temperature and high humidity, and excellent optical characteristics such as light transmittance and haze along with the above-described diene and olefin-based compound having one carbon-carbon double bond.

The pressure-sensitive adhesive composition of the present invention, as described above, may include an active energy ray-polymerizable compound having a high compatibility with an encapsulating resin, and forming a specific crosslinking structure along with the encapsulating resin. That is, the active energy ray-polymerizable compound satisfying Formula 1 may particularly have an excellent compatibility with the encapsulating resin of the present invention to satisfy optical characteristics and reliability at high temperature and high humidity. For example, the active energy ray-polymerizable compound may realize a pressure-sensitive adhesive composition having an excellent moisture barrierability, excellent reliability at high temperature and high humidity, and excellent optical characteristics such as light transmittance and a haze along with the above-described copolymer of a diene and an olefin-based compound having one carbon-carbon double bond.

The active energy ray-polymerizable compound may refer to, for example, a compound including at least two of functional groups that can participate in a polymerization reaction by irradiation of an active energy ray, for example, a functional group including an ethylene-like unsaturated double bond such as an acryloyl group or a methacryloyl group, and a functional group such as an epoxy group or an oxetane group.

As described above, the active energy ray-polymerizable compound may satisfy Formula 1:

[Formula 1]

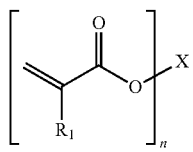

In Formula 1, $R_1$ is hydrogen or an alkyl group having 1 to 4 carbon atoms, n is an integer of 2 or more, and X is a residue induced from a linear, branched, or cyclic alkyl group having 3 to 30 carbon atoms. Here, when X is a residue induced from a cyclic alkyl group, X may be a residue induced from a cyclic alkyl group having 3 to 30, 6 to 28, 8 to 22, or 12 to 20 carbon atoms. In addition, when X is a residue induced from a linear alkyl group, X may be a residue induced from a linear alkyl group having 3 to 30, 6 to 25, or 8 to 20 carbon atoms. In addition, when X is a residue induced from a branched alkyl group, X may be a residue induced from a branched alkyl group having 3 to 30, 5 to 25, or 6 to 20 carbon atoms.

The term "residue induced from an alkyl group" used herein may refer to a residue of a specific compound, which is formed of an alkyl group. In one example, in Formula 1, when n is 2, X may be an alkylene group. In addition, when n is 3 or more, at least two hydrogens of an alkyl group are released and bind to a (meth)acryloyl group of Formula 1.

The term "alkyl group" used herein may be, unless particularly defined otherwise, an alkyl group having 1 to 30, 1 to 25, 1 to 20, 1 to 16, 1 to 12, 1 to 8, or 1 to 4 carbon atoms. The alkyl group may have a linear, branched, or cyclic structure, and may be optionally substituted by at least one substituent.

The term "alkylene group" used herein may be, unless particularly defined otherwise, an alkylene group having 2 to 30, 2 to 25, 2 to 20, 2 to 16, 2 to 12, 2 to 10, or 2 to 8 carbon atoms. The alkylene group may have a linear, branched, or cyclic structure, and may be optionally substituted by at least one substituent.

The active energy ray-polymerizable compound may be included at 5 to 30, 5 to 25, 8 to 20, 10 to 18, or 12 to 18 parts by weight relative to 100 parts by weight of the encapsulating resin.

A multifunctional active energy ray-polymerizable compound that can be polymerized by the irradiation of an active energy ray may be used without limitation as long as satisfying Formula 1. For example, the compound may be 1,4-butanediol di(meth)acrylate, 1,3-butylene glycol di(meth)acrylate, 1,6-hexanediol di(meth)acrylate, 1,8-octanediol di(meth)acrylate, 1,12-dodecanediol di(meth)acrylate, neopentylglycol di(meth)acrylate, dicyclopentanyl di(meth)acrylate, cyclohexane-1,4-dimethanol di(meth)acrylate, tricyclodecanedimethanol (meth)diacrylate, dimethylol dicyclopentane di(meth)acrylate, neopentylglycol modified trimethylpropane di(meth)acrylate, adamantane di(meth) acrylate, trimethylolpropane tri(meth)acrylate, or a mixture thereof.

As the multifunctional active energy ray-polymerizable compound, for example, a compound having a molecular weight of less than 1,000 and including at least two functional groups may be used. In this case, the molecular weight may refer to a weight average molecular weight or a conventional molecular weight. A cyclic structure included in the multifunctional active energy ray-polymerizable compound may be any one of a carbocyclic structure, a heterocyclic structure, a monocyclic structure, and a polycyclic structure.

In addition, in an exemplary embodiment of the present invention, the pressure-sensitive adhesive composition may further include a silane compound satisfying Formula 2:

[Formula 2]

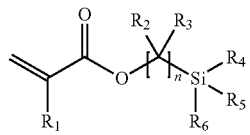

In Formula 2, $R_1$ is hydrogen or an alkyl group. $R_1$ may be, for example, an alkyl group having 1 to 4 or 1 to 2 carbon atoms. In addition, in Formula 2, $R_2$ and $R_3$ are each independently hydrogen, or a linear, branched, or cyclic alkyl group, or when $R_2$ is linked with $R_3$, a cyclic alkyl group may be formed. For example, $R_2$ and $R_3$ may be each independently hydrogen, or a linear, branched, or cyclic alkyl group. Here, the linear alkyl group may have 1 to 10, 1 to 6, or 1 to 4 carbon atoms, the branched alkyl group may have 3 to 10, 3 to 6, or 3 to 4 carbon atoms, and the cyclic alkyl group may have 3 to 10, 3 to 8, 3 to 6, or 3 to 4 carbon atoms.

In addition, when $R_2$ is linked with $R_3$, a cyclic alkyl group having 2 to 10, 3 to 10, 4 to 9, or 4 to 8 carbon atoms may be formed. In addition, in Formula 1, $R_4$, $R_5$, and $R_6$ may each independently hydrogen, an alkyl group, or an alkoxy group, at least one of $R_4$, $R_5$, and $R_6$ is an alkoxy group, and n is an integer of 1 or more. Specifically, the $R_4$, $R_5$, and $R_6$ may be each independently an alkyl group having 1 to 10, 1 to 6, 1 to 4, or 1 to 2 carbon atoms; or an alkoxy group having 1 to 10, 1 to 8, 1 to 4, or 1 to 2 carbon atoms. Here, at least one of $R_4$, $R_5$, and $R_6$ may be an alkoxy group, and all of $R_4$, $R_5$, and $R_6$ may be alkoxy groups, but the present invention is not limited thereto.

The term "alkoxy group" used herein may be, unless particularly defined otherwise, an alkoxy group having 1 to 20, 1 to 16, 1 to 12, 1 to 8, or 1 to 4 carbon atoms. The alkoxy group may be a linear, branched, or cyclic type. In addition, the alkoxy group may be optionally substituted by at least one substituent.

In one example, the silane compound may be, for example, 3-methacryloxypropyl trimethoxysilane, 3-methacryloxy propyl triethoxysilane, 3-acryloxy propyl trimethoxysilane, 3-acryloxy propyl triethoxysilane, 3-methacryloxy methyl triethoxysilane, 3-methacryloxy methyl trimethoxysilane, 3-acryloxy propyl methyldimethoxysilane, methacryloxy methyl methyldimethoxysilane, methacryloxy methyl methyldiethoxysilane, methacryloxy propyl methyldimethoxysilane, methacryloxy propyl methyldiethoxysilane, methacryloxy propyl dimethylmethoxysilane, or methacryloxy propyl dimethylethoxysilane. An acryl group of the silane compound may serve to increase an interface pressure-sensitive adhesive strength by being crosslinked with the encapsulating resin or active energy ray-polymerizable compound of the pressure-sensitive adhesive composition. The silane compound may be included at 0.1 to 10, 0.5 to 8, 0.8 to 5, 1 to 5, 1 to 4.5, or 1 to 4 parts by weight relative to 100 parts by weight of the encapsulating resin.

In one example, the active energy ray-polymerizable compound may form a crosslinking structure with the silane compound satisfying Formula 2, and the crosslinking structure may form a semi-interpenetrating polymer network (semi-PIN) with the encapsulating resin. That is, the pressure-sensitive adhesive composition may include a semi-IPN. The term "semi-IPN" includes at least one polymer crosslinking structure (polymer network) and at least one linear or branched polymer, and at least a part of the linear or branched polymer has a structure penetrated into the polymer crosslinking structure. The semi-IPN may be distinguished from an IPN structure since the linear or branched polymer can be theoretically separated from the polymer crosslinking structure without loss of a chemical bond.

In one exemplary embodiment, the crosslinking structure may be a crosslinking structure formed by application of heat, a crosslinking structure formed by irradiation of an active energy ray, or a crosslinking structure formed by aging at room temperature. Here, in the category of the "active energy ray", a microwave, an infrared (IR) ray, an ultraviolet (UV) ray, an X ray and a gamma ray, and a particle beam such as an alpha-particle beam, a proton beam, a neutron beam, or an electron beam, and conventionally, an UV ray and an electron beam may be included. As such a semi-IPN structure is introduced, a mechanical property such as processability of the pressure-sensitive adhesive composition may be increased, humidity-resistant adhesive performance is improved, transparency is realized, high moisture barrier performance that cannot be achieved so far, and an excellent panel lifetime may be realized.

In one example, the active energy ray-polymerizable compound may form a crosslinking structure with the silane compound satisfying Formula 2, and the encapsulating resin may form a crosslinking structure with the active energy ray-polymerizable compound or the silane compound satisfying Formula 2, thereby forming an interpenetrating polymer network (IPN) structure. In addition, the term "IPN structure" refers to a state in which at least two crosslinking structures are present in a pressure-sensitive adhesive. In one example, the IPN structure may refer to a structure including at least two crosslinking structures in an intertwining, entanglement, or penetrating state. For example, the composition of the present invention may include a crosslinking structure by an encapsulating resin (hereinafter, referred to as a "first crosslinking structure") and a crosslinking structure formed by a reaction of an active energy ray-polymerizable compound and the silane compound satisfying Formula 2 (hereinafter, referred to as a "second crosslinking structure"), and the first and second crosslinking structures may be in an interwinding state or an entanglement state. That is, when the pressure-sensitive adhesive composition includes a semi-IPN or IPN structure in a crosslinked state, excellent durability and reliability of a pressure-sensitive adhesive may be realized under harsh conditions such as high temperature and high humidity.

In an exemplary embodiment of the present invention, the pressure-sensitive adhesive composition may further include a radical initiator that can induce a polymerization reaction of the above-described active energy ray-polymerizable compound. The radical initiator may be a photoinitiator or a thermal initiator. A specific type of the photoinitiator maybe suitably selected in consideration of a curing rate and yellowing probability. For example, as the photoinitiator, a benzoin-, hydroxy ketone-, amino ketone-, or phosphine oxide-based photoinitiator, and specifically, benzoin, benzoin methylether, benzoin ethylether, benzoin isopropylether, benzoin n-butylether, benzoin isobutylether, acetophenone, dimethylamino acetophenone, 2,2-dimethoxy-2-phenylacetophenone, 2,2-diethoxy-2-phenylacetophenone, 2-hydroxy-2-methyl-1-phenylpropane-1one, 1-hydroxycyclohexylphenylketone, 2-methyl-1-[4-(methylthio)phenyl]-2-morpholino-propane-1-one, 4-(2-hydroxyethoxyl)phenyl-2-(hydroxy-2-propyl)ketone, benzophenone, p-phenylbenzophenone, 4,4'-diethylaminobenzophenone, dichlorobenzophenone, 2-methylanthraquinone, 2-ethylanthraquinone, 2-t-butylanthraquinone, 2-aminoanthraquinone, 2-methylthioxanthone, 2-ethylthioxanthone, 2-chlorothioxanthone, 2,4-dimethylthioxanthone, 2,4-diethylthioxanthone, benzyldimethylketal, acetophenone dimethylketal, p-dimethylamino benzoic acid ester, oligo[2-hydroxy-2-methyl-1-[4-(1-methylvinyl)phenyl]propanone], or 2,4,6-trimethylbenzoyl-diphenyl-phosphineoxide may be used.

The radical initiator may be included at 0.2 to 20, 0.5 to 18, 1 to 15, or 2 to 13 parts by weight relative to 100 parts by weight of the active energy ray-polymerizable compound. Accordingly, the reaction of the active energy ray-polymerizable compound is effectively induced, and degradation of physical properties of the pressure-sensitive adhesive composition due to remaining components after curing may be prevented.

In one example, the pressure-sensitive adhesive composition may further include a tackifier. The tackifier may be a hydrogenated cyclic olefin-based polymer. As the tackifier, for example, a hydrogenated petroleum resin obtained by hydrogenating a petroleum resin may be used. The hydrogenated petroleum resin may be partially or completely hydrogenated, and may be a mixture of such resins. Such a tackifier may have a high compatibility with the pressure-sensitive adhesive composition, excellent moisture barrierability, and a small content of an organic volatile component. A specific example of the hydrogenated petroleum resin may be a hydrogenated terpene-based resin, a hydrogenated ester-based resin, or a hydrogenated dicyclopentadiene-based resin. The tackifier may have a weight average molecular weight of approximately 200 to 5,000. A content of the tackifier may be suitably controlled as needed. For example, the content of the tackifier may be selected in consideration of a gel content that will be described below or compatibility with the encapsulating resin. According to one example, the tackifier may be included at 5 to 100, 8 to 95, 10 to 93, or 15 to 90 parts by weight relative to 100 parts by weight of a solid content of the pressure-sensitive adhesive composition.

The pressure-sensitive adhesive composition may further include a moisture absorbent when needed. The term "moisture absorbent" may refer to a material that can remove moisture or vapor penetrated into the following pressure-sensitive adhesive film through a chemical reaction. When the pressure-sensitive adhesive composition of the present invention includes a moisture absorbent, to be formed in a film, the following light transmittance may not be realized, but excellent moisture barrier ability may be realized. Specifically, the pressure-sensitive adhesive composition may be formed in a film to be applied to encapsulation of an organic electronic device. In this case, when the pressure-sensitive adhesive composition does not include a moisture absorbent and exhibits excellent transparency, it may be applied to encapsulation of a top-emissive organic electronic device, or when the pressure-sensitive adhesive composition includes a moisture absorbent and exhibit excellent moisture barrierability, it may be applied to encapsulation of a bottom-emissive organic electronic device. However, the present invention is not limited thereto. That is, when the pressure-sensitive adhesive composition does not include a moisture absorbent and exhibits excellent transparency, it may be applied to encapsulation of a bottom-emissive organic electronic device.

For example, the moisture absorbent may be present while being uniformly dispersed in the pressure-sensitive adhesive composition or the following pressure-sensitive adhesive layer. Here, the uniformly dispersed state may mean a state in which the moisture absorbent is present even in any part of the pressure-sensitive adhesive composition or the pressure-sensitive adhesive layer at the same or substantially the same density. As the moisture absorbent used herein, for example, a metal oxide, a sulfate, or an organic metal oxide may be used. Specifically, the sulfate may be magnesium sulfate, sodium sulfate, or nickel sulfate, and the organic metal oxide may be aluminum oxide octylate. Here, the metal oxide may be phosphorus pentoxide ($P_2O_5$), lithium oxide ($Li_2O$), sodium oxide ($Na_2O$), barium oxide (BaO), calcium oxide (CaO), or magnesium oxide (MgO), and the metal salt may be a sulfate such as lithium sulfate ($Li_2SO_4$), sodium sulfate ($Na_2SO_4$), calcium sulfate ($CaSO_4$), magnesium sulfate ($MgSO_4$), cobalt sulfate ($CoSO_4$), gallium sulfate ($Ga_2(SO_4)_3$), titanium sulfate ($Ti(SO_4)_2$), or nickel sulfate ($NiSO_4$); a metal halide such as calcium chloride ($CaCl_2$), magnesium chloride ($MgCl_2$), strontium chloride ($SrCl_2$), yttrium chloride ($YCl_3$), copper chloride ($CuCl_2$), cesium fluoride (CsF), tantalum fluoride ($TaF_5$), niobium fluoride ($NbF_5$), lithium bromide (LiBr), calcium bromide ($CaBr_2$), cesium bromide ($CeBr_3$), selenium bromide ($SeBr_4$), vanadium bromide ($VBr_3$), magnesium bromide ($MgBr_2$), barium iodide ($BaI_2$), or magnesium iodide ($MgI_2$); or a metal chlorate such as barium perchlorate ($Ba(ClO_4)_2$) or magnesium perchlorate ($Mg(ClO_4)_2$), but the present invention is not limited thereto. As the moisture absorbent that can be included in the pressure-sensitive adhesive composition, one or at least two of the above-described materials may be used. In one example, when at least two of the above materials are used, the moisture absorbent may be calcined dolomite.

Such a moisture absorbent may be controlled in a suitable size according to its use. In one example, an average diameter of the moisture absorbent may be controlled to approximately 10 to 15000 nm. A moisture absorbent having the above range of the average diameter may be easy to be stored due to a not too high reaction speed with moisture, and may effectively remove moisture without damage to an element to be encapsulated.

A content of the moisture absorbent may be suitably selected without particular limitation in consideration of a desired barrier characteristic.

The pressure-sensitive adhesive composition may further include a moisture blocker when needed. The term "moisture blocker" used herein may refer to a material that can block or prevent migration of moisture or vapor in the film while having no or low reactivity with moisture. As the moisture blocker, one or at least two of clay, talc, pin-type silica, planar silica, porous silica, zeolite, titania, and zirconia may be used. In addition, a surface of the water blocker may be treated with an organic modifier to facilitate penetration of an organic material. Such an organic modifier, dimethyl benzyl hydrogenated tallow quaternary ammonium, dimethyl hydrogenated tallow quaternary ammonium, methyl tallow bis-2-hydroxyethyl quaternary ammonium, dimethyl hydrogenated tallow 2-ethylhexyl quaternary ammonium, dimethyl dehydrogenated tallow quaternary ammonium, or a mixture thereof may be used.

A content of the moisture blocker may be suitably selected without particular limitation in consideration of a desired blocking characteristic.

In addition to the above-described components, various additives may be included in the pressure-sensitive adhesive composition according to its use and a process of manufacturing a pressure-sensitive adhesive film that will be described below. For example, the pressure-sensitive adhesive composition may include a curable material, a crosslinking agent, or a filler at a suitable range of content according to a desired physical property.

In one example, the pressure-sensitive adhesive composition of the present invention may have a gel content represented by Equation 1 of 50% or more.

$$\text{Gel content (\%)} = B/A \times 100 \qquad \text{[Equation 1]}$$

In Equation 1, A is a mass of the pressure-sensitive adhesive composition, and B is a dry mass of an insoluble content of the pressure-sensitive adhesive composition remaining after being dipped in toluene at 60° C. for 24 hours and filtered through a 200-mesh filter (pore size of 200 μm).

The gel content represented by Equation 1 may be 50 to 99%, 50 to 90%, 50 to 80%, or 50 to 70%. That is, in the present invention, a pressure-sensitive adhesive composition having an excellent moisture blocking characteristic, reliability, and an optical characteristic may be realized, in consideration of a crosslinking structure and a suitable range of a degree of crosslinking of the pressure-sensitive adhesive composition through the gel content.

In another aspect, the present invention provides a pressure-sensitive adhesive film. The pressure-sensitive adhesive film may include a pressure-sensitive adhesive layer, which may include the above-described pressure-sensitive adhesive composition or a crosslinked product thereof. The pressure-sensitive adhesive layer may be formed in a film or sheet. Such a pressure-sensitive adhesive layer may be used to encapsulate an organic electronic element.

In an exemplary embodiment of the present invention, the pressure-sensitive adhesive layer may be formed in a monolayer structure as described above, or may be formed in a multilayer structure including at least two layers that will be described below. For example, the pressure-sensitive adhesive layer may include a first layer containing the above-described pressure-sensitive adhesive composition or a crosslinked product thereof and a second layer including a pressure-sensitive adhesive resin or an adhesive resin. The pressure-sensitive adhesive resin or adhesive resin included in the second layer may be the same as or different from the above-described encapsulating resin, and may be suitably selected by a conventional technician according to a purpose. In addition, the first and second layers may or may not include a moisture absorbent.

In one example, the pressure-sensitive adhesive resin included in the second layer may include a curable resin including at least one heat-curable functional group such as a glycidyl group, an isocyanate group, a hydroxyl group, a carboxyl group, or an amide group, or an electromagnetic wave-curable functional group such as an epoxide group, a cyclic ether group, a sulfide group, an acetal group, or a lactone group, which may be cured to exhibit an adhesive characteristic. In addition, a specific type of such a resin may be, but is not limited to, an acryl resin, a polyester resin, an isocyanate resin, or an epoxy resin.

In the present invention, as the curable resin, an aromatic or aliphatic, or linear or branched epoxy resin may be used. In one exemplary embodiment of the present invention, an epoxy resin containing at least two functional groups and having an epoxy equivalent of 180 to 1,000 g/eq may be used. When the epoxy resin having the above range of epoxy equivalent is used, characteristics of the cured product such as adhesive performance and a glass transition temperature may be effectively maintained. Such an epoxy resin may be one or a mixture of at least two of a cresol novolac epoxy resin, a bisphenol A-type epoxy resin, a bisphenol A-type novolac epoxy resin, a phenol novolac epoxy resin, a tetrafunctional epoxy resin, a biphenyl-type epoxy resin, a triphenol methane-type epoxy resin, an alkyl-modified triphenol methane epoxy resin, a naphthalene-type epoxy resin, a dicyclopentadiene-type epoxy resin, and a dicyclopentadiene modified phenol-type epoxy resin.

In an exemplary embodiment of the present invention, the second layer may include another component such as an active energy ray-polymerizable compound, a radical initiator, a tackifier, a moisture absorbent, a moisture blocker, a dispersing agent, or a silane compound, which may be the same as or different from that of the first layer, in addition to the above-described resin. In addition, the second layer may include a curable material, a curing agent, or a filler at a suitable range of content according to a desired physical property.

A sequence of laminating the first and second layers is not particularly limited, and thus the second layer may be formed on the first layer, or the first layer may be formed on the second layer.

In one example, the pressure-sensitive adhesive film may include a barrier film on one surface of the pressure-sensitive adhesive layer. The barrier film may be formed of any material generally used in the art without limitation. For example, here, the barrier film may include a base layer, an organic undercoating layer, an inorganic deposition layer, and an organic top-coating layer, and the organic top-coating layer may be in contact with the pressure-sensitive adhesive layer.

The pressure-sensitive adhesive film may have a water vapor transmission rate (WVTR) measured with respect to a thickness direction of the film while being manufactured in a film having a thickness of 10 μm of 50, 40, 30, 20, or 10 g/m²·day or less at 100° F. and a relative humidity of 100%. By controlling a composition or crosslinking condition of a pressure-sensitive adhesive layer including a pressure-sensitive adhesive composition to have such a WVTR, an encapsulation or capsulation structure which can stably protect an element by effectively blocking moisture or oxygen penetrated from an external environment when being applied to an encapsulation or capsulation structure of an electronic device may be realized. The lower WVTR, the better moisture barrierability, and therefore the lower limit of the WVTR may be, but is not particularly limited to, 0 g/m²·day.

In addition, the pressure-sensitive adhesive film may have an excellent light transmittance with respect to a visible-ray region. In one example, the pressure-sensitive adhesive film of the present invention may have a light transmittance of 88%, 89%, or 90% or more with respect to the visible-ray region. In addition, the pressure-sensitive adhesive film of the present invention may exhibit a low haze with the excellent light transmittance. In one example, the pressure-sensitive adhesive film may have a haze of 3%, 2.8%, 2.5%, 2.3%, 2.2%, or 2.0% or less. The pressure-sensitive adhesive composition according to the present invention may minimize the change in a haze.

The pressure-sensitive adhesive film may further include a base film or release film (hereinafter, can be referred to as a "first film"), and have a structure in which the pressure-sensitive adhesive layer is formed on the base or release film. The structure may further include a base or release film formed on the pressure-sensitive adhesive layer (hereinafter, can be referred to as a "second film").

FIGS. 1 and 2 are cross-sectional views of exemplary pressure-sensitive adhesive films.

The pressure-sensitive adhesive film 1, as shown in FIG. 1, may include a pressure-sensitive adhesive layer 11 formed on a base or release film 12. Another exemplary pressure-sensitive adhesive film 2, as shown in FIG. 2, may further include a base or release film 21 formed on the pressure-sensitive adhesive layer 11. Although not shown in FIGS. 1 and 2, the pressure-sensitive adhesive film may also have the pressure-sensitive adhesive composition without a supporting base such as a base or release film, and therefore have a structure only including a pressure-sensitive adhesive layer formed in a film or sheet maintaining a solid phase or a semi-solid phase at room temperature, or a structure in which a pressure-sensitive adhesive layer is formed on both surfaces of one base or release film.

A specific type of the first film is not particularly limited. As the first film, for example, a plastic film may be used. The first film may be a polyethyleneterephthalate film, a polytetrafluoroethylene film, a polyethylene film, a polypropylene film, a polybutene film, a polybutadiene film, a vinyl chloride copolymer film, a polyurethane film, an ethylene-vinyl acetate film, an ethylene-propylene copolymer film, an ethylene-ethyl acrylate copolymer film, an ethylene-methyl acrylate copolymer film, or a polyimide film.

When the first film is a release film, suitable release treatment may be performed on one or both surfaces of such a plastic film. As a releasing agent used for release treatment, an alkyd-based releasing agent, a silicon-based releasing agent, a fluorine-based releasing agent, an fluorinated ester-based releasing agent, a polyolefin-based releasing agent, or a wax-based releasing agent may be used. In consideration of heat resistance, an alkyd-based releasing agent, a silicon-based releasing agent, or a fluorine-based releasing agent among the above examples may be conventionally used, but the present invention is not limited thereto.

As the first film, for example, a plastic film in which a gas barrier layer is formed on a top or side surface of a base may be used. Such a film may directly constitute, for example, a substrate of an organic electronic device to be used for realizing a flexible device.

A type of the second film is not particularly limited, either. For example, as the second film, within the category of the first film listed above, one that is the same as or different from the first film may be used.

A thickness of the first or second film is not particularly limited. In one example, the thickness of the first film may be approximately 50 to 500 or 100 to 200 μm. In such a range, a process of preparing or manufacturing a pressure-sensitive adhesive or an organic electronic device may be effectively automated, and advantageous effects in terms of economic feasibility may be achieved.

The thickness of the second film is not particularly limited, either. For example, the thickness of the second film may be the same as, or relatively smaller or larger than that of the first film.

The pressure-sensitive adhesive layer of the pressure-sensitive adhesive film includes the pressure-sensitive adhesive composition, and is formed in a film or sheet. In the pressure-sensitive adhesive layer, the pressure-sensitive adhesive composition may be in a crosslinked or non-crosslinked state. The pressure-sensitive adhesive layer may be in a solid or semi-solid phase at room temperature. The curable pressure-sensitive adhesive resin included in the solid or semi-solid pressure-sensitive adhesive layer may be in a non-crosslinked state. Such a pressure-sensitive adhesive resin may form a crosslinked structure in an encapsulation structure of an organic electronic element, which will be described below.

A thickness of the pressure-sensitive adhesive layer is not particularly limited, and may be suitably selected in consideration of its uses. For example, the pressure-sensitive adhesive layer may have a thickness of approximately 5 to 200 µm. The thickness of the pressure-sensitive adhesive layer may be controlled in consideration of, for example, embeddability when being used as an encapsulant of an organic electronic element and processability or economic feasibility.

In still another aspect, the present invention provides a method of manufacturing a pressure-sensitive adhesive film. The exemplary pressure-sensitive adhesive film may be manufactured by plasticizing the pressure-sensitive adhesive composition in a film or sheet.

In one example, the method may include applying a coating solution including the pressure-sensitive adhesive composition on a base or release film in a sheet or film, and drying the applied coating solution. The method may further include adhering an additional base or release film to the dried coating solution.

The coating solution including the pressure-sensitive adhesive composition may be prepared by, for example, dissolving or dispersing components of each pressure-sensitive adhesive composition described above in a suitable solvent. In one example, the pressure-sensitive adhesive composition may be prepared by dissolving or dispersing the moisture absorbent, blocker, or filler in a solvent when needed, grinding the resulting product, and mixing the moisture absorbent, blocker, or filler with an encapsulating resin.

A type of a solvent used in preparation of the coating solution is not particularly limited. However, when time to dry the solvent is too long, or it is necessary to dry the solvent at a high temperature, there may have some problems in workability or durability of a pressure-sensitive adhesive film. For this reason, a solvent having a volatile temperature of 150° C. or less may be used. In consideration of film moldability, a small amount of the solvent having the above range of the volatile temperature may be used. The solvent may be, but is not limited to, one or at least two of methylethylketone (MEK), acetone, toluene, dimethyl formamide (DMF), methyl cellosolve (MCS), tetrahydrofuran (THF), xylene, and N-methylpyrrolidone (NMP).

A method of applying the coating solution to the base or release film may be, but is not particularly limited to, a known coating method such as knife coating, roll coating, spray coating, gravure coating, curtain coating, comma coating, or lip coating.

The applied coating solution may be dried to volatilize the solvent, thereby forming a pressure-sensitive adhesive layer. The drying may be performed, for example, at 70 to 150° C. for 1 to 10 minutes. The drying condition may be changed in consideration of a type of the used solvent.

After drying, an additional base or release film may be formed on the pressure-sensitive adhesive layer.

In yet another aspect, the present invention provides a product for encapsulating an organic electronic device. The product for encapsulating an organic electronic device may include a substrate; an organic electronic element formed on the substrate; and a pressure-sensitive adhesive film encapsulating an entire surface, for example, top and side surfaces of the organic electronic element. The pressure-sensitive adhesive film may include a pressure-sensitive adhesive layer containing a pressure-sensitive adhesive composition in a crosslinked state. The product for encapsulating an organic electronic device may further include a cover substrate formed on a top surface of the pressure-sensitive adhesive layer.

Here, the organic electronic element may be, for example, an organic light emitting element.

In yet another aspect, the present invention provides a method of manufacturing an organic electronic device. The product for encapsulating an organic electronic device may be manufactured using, for example, the pressure-sensitive adhesive film.

The pressure-sensitive adhesive layer may be formed as an encapsulating layer for a structure exhibiting excellent moisture barrier property and optical property in the organic electronic device, efficiently fixing and supporting the substrate and a cover substrate.

In addition, the pressure-sensitive adhesive layer may exhibit excellent transparency, and may be stable regardless of a type of the organic electronic device, for example, a top-emissive or bottom-emissive organic electronic device.

The term "encapsulating layer" used herein may refer to a pressure-sensitive adhesive layer covering top and side surfaces of the organic electronic element.

FIG. 3 is a schematic diagram of an exemplary organic electronic device in which an organic electronic element is an organic light emitting element.

To manufacture the organic electronic device, for example, applying the above-described pressure-sensitive adhesive film to the substrate on which the organic electronic element is formed to cover the organic electronic element; and curing the pressure-sensitive adhesive film may be included.

The term "curing" used herein may refer to preparing a pressure-sensitive adhesive by forming the pressure-sensitive adhesive composition of the present invention to have a crosslinking structure through heating or UV irradiation.

Specifically, an organic electronic element 32 may be formed by forming a transparent electrode on a glass or polymer film 31 used as a substrate by a method such as vacuum deposition or sputtering, forming layers of emissive organic materials, composed of, for example, a hole transport layer, an emitting layer, and an electron transport layer on the transparent electrode, and further forming an electrode layer thereon. Subsequently, a pressure-sensitive adhesive layer of the pressure-sensitive adhesive film is disposed to cover an entire surface of the organic electronic element 32 of the substrate 31 subjected to the above-described process.

Subsequently, an encapsulating layer may be formed by compressing the pressure-sensitive adhesive layer on the organic electronic element using a laminator while heating the pressure-sensitive adhesive layer to provide mobility, and crosslinking a resin in the pressure-sensitive adhesive layer.

In one example, a pressure-sensitive adhesive layer 33 disposed to cover an entire surface of the organic electronic element 32 may be previously transferred to a cover substrate 34 such as a glass or a polymer film. The transfer of the pressure-sensitive adhesive layer to the cover substrate 34 may be performed using a vacuum press or vacuum laminator while being heated in a state in which the pressure-sensitive adhesive layer is in contact with the cover substrate 34, after peeling a first or second film from the pressure-sensitive adhesive film. When the pressure-sensitive adhesive includes a heat-curable pressure-sensitive adhesive resin and a curing reaction is excessively performed during the process, a cohesive strength or pressure-sensitive adhesive strength of the encapsulating layer is probably reduced. Therefore, a process temperature may be controlled to approximately 100° C. or less, and a process time may be controlled within 5 minutes.

An encapsulating layer may be formed by disposing the cover substrate 34 to which the pressure-sensitive adhesive is transferred on the organic electronic element 32, and performing the heat compression process.

The encapsulating layer may be formed by curing the pressure-sensitive adhesive layer 33. The curing process may be performed in a suitable heating chamber or UV chamber, for example, according to a method of curing a curable pressure-sensitive adhesive resin. A heating condition or a condition of irradiating an active energy ray maybe suitably selected in consideration of stability of the organic electronic element and curability of the pressure-sensitive adhesive resin, and to increase a compression efficiency, autoclaving with co-application of heat and pressure may be performed.

Here, one example of the method of manufacturing an organic electronic device is described, but the organic electronic device may be manufactured by a different method. For example, the manufacture of the device is performed by the above-described method, but a sequence or condition of the process may be changed. For example, the encapsulating layer may be formed by previously transferring the pressure-sensitive adhesive layer to the substrate 31, not to the cover substrate 34, and performing a curing process while the cover substrate 34 is laminated.

Effects

The present invention can provides a pressure-sensitive adhesive composition that can effectively prevent moisture or oxygen added to an organic electronic device from an external environment, and exhibit reliability under harsh conditions such as high temperature and high humidity and excellent optical characteristics, and a pressure-sensitive adhesive film including the same.

Figure 1:
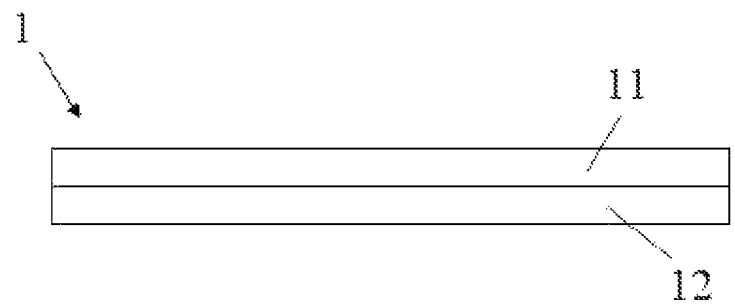
FIGS. 1 and 2 are cross-sectional views of pressure-sensitive adhesive films according to exemplary embodiments of the present invention.
Figure 2:
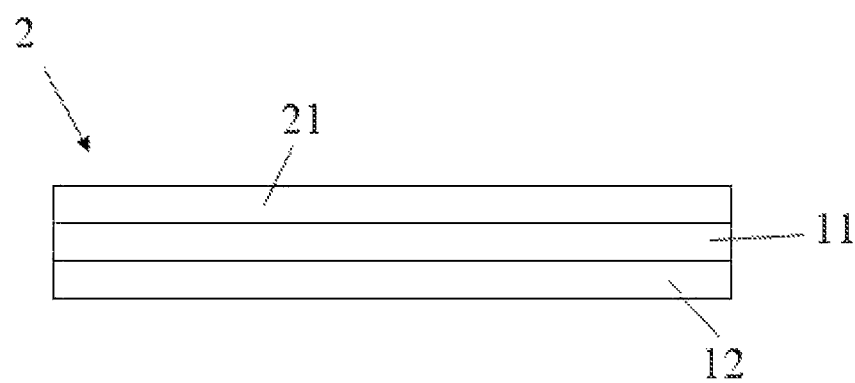
Figure 3:
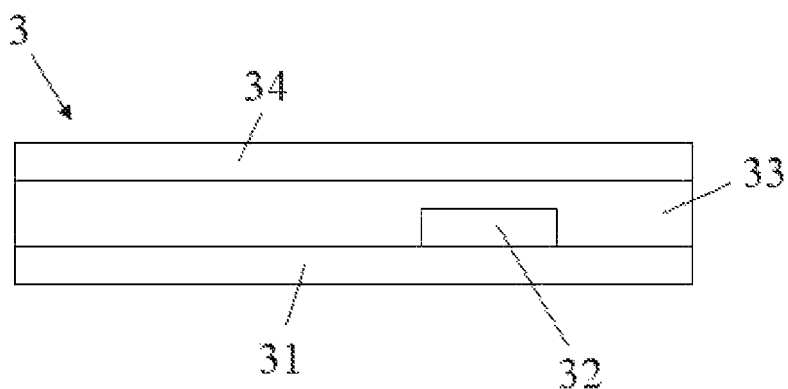
FIG. 3 is a cross-sectional view of an encapsulating product for an organic electronic device according to an exemplary embodiment of the present invention.

DESCRIPTION OF REFERENCE NUMERALS 1, 2: pressure-sensitive adhesive film
11: pressure-sensitive adhesive layer
12: first film
21: second film
3: organic electronic device
31: substrate
32: organic electronic element
33: pressure-sensitive adhesive layer or encapsulating layer
34: cover substrate

DETAILED DESCRIPTION OF EXEMPLARY EMBODIMENTS

Hereinafter, the present invention will be described in detail with reference to Examples and Comparative Examples, but the scope of the present invention is not limited to the following Examples.

EXAMPLE 1

A coating solution was prepared by adding 70 g of a butyl rubber (Br268, EXXON) as an encapsulating resin, 30 g of a hydrogenated DCPD-based tackifier resin (SU-90, Kolon) as a tackifier, 20 g of tricyclodecane dimethanol diacrylate (SR833S, Sartomer) as an active energy ray-polymerizable compound, and 1 g of 2,2-dimethoxy-1,2-diphenylethane-1-one (Irgacure651, Ciba) as a radical initiator, and diluting the mixture in toluene to have a solid content of approximately 15 wt %.

The prepared solution was coated on a released surface of release PET, and dried in an oven at 100° C. for 15 minutes, thereby manufacturing a pressure-sensitive adhesive film including a pressure-sensitive adhesive layer having a thickness of 50 μm. Physical properties of the sample were measured after UV rays were irradiated at 2 J/cm$^2$ on the manufactured film.

EXAMPLE 2

A pressure-sensitive adhesive film was manufactured by the same method as described in Example 1, except that 1,8-octanediol diacrylate was used as anactive energy ray-polymerizable compound, instead of tricyclodecane dimethanol diacrylate.

EXAMPLE 3

A pressure-sensitive adhesive film was manufactured by the same method as described in Example 1, except that trimethylolpropane triacrylate was used as an active energy ray-polymerizable compound, instead of tricyclodecane dimethanol diacrylate.

COMPARATIVE EXAMPLE 1

A pressure-sensitive adhesive film was manufactured by the same method as described in Example 1, except that 70 g of polyisobutylene (BASF, B80) was used as an encapsulating resin.

COMPARATIVE EXAMPLE 2

A pressure-sensitive adhesive film was manufactured by the same method as described in Example 1, except that dipropylene glycol diacrylate was used as an active energy ray-polymerizable compound, instead of tricyclodecane dimethanol diacrylate.

COMPARATIVE EXAMPLE 3

A pressure-sensitive adhesive film was manufactured by the same method as described in Example 2, except that octyl acrylate was used as an active energy ray-polymerizable compound, instead of 1,8-octanediol diacrylate.

COMPARATIVE EXAMPLE 4

A pressure-sensitive adhesive film was manufactured by the same method as described in Example 1, except that dipentaerythritol hexaacrylate was used as an active energy ray-polymerizable compound, instead of tricyclodecane dimethanol diacrylate.

COMPARATIVE EXAMPLE 5

A pressure-sensitive adhesive film was manufactured by the same method as described in Example 1, except that polybutadiene dimethacrylate was used as the active energy ray-polymerizable compound, instead of tricyclodecane dimethanol diacrylate.

Hereinafter, physical properties were evaluated by the following methods in the Examples and Comparative Examples.

1. Get Content

Gel content (%)=B/A×100

Here, A is a mass of the pressure-sensitive adhesive composition, and B is a dry mass of an insoluble content of the pressure-sensitive adhesive composition remaining after being dipped in toluene at 60° C. for 24 hours and filtered through a 200-mesh filter (pore size: 200 μm).

2. Evaluation of Reliability

A sample was prepared by laminating the film manufactured in Example or Comparative Example on a barrier film (serving as a cover substrate), laminating the resulting product on a substrate, and pressure and heat-compressing the resulting product using an autoclave at 50° C. and 5 atm. Afterward, the sample was maintained in a constant temperature and constant humidity chamber at 85° C. and a relative humidity of 85% for approximately 500 hours, and it was observed whether lifting, bubbles, or hazes were generated at an interface between a glass substrate and a pressure-sensitive adhesive layer. When being viewed with the naked eye, at the interface between the glass substrate and the pressure-sensitive adhesive layer, if at least one lifting, bubble, or haze was generated, it was represented as X, and if no lifting, bubble, or haze was generated, it was represented as O.

3. Measurement of Light Transmittance and Haze

A light transmittance of the pressure-sensitive adhesive film manufactured as described above was measured at 550 nm using a UV-VIS spectrometer, and a haze of the pressure-sensitive adhesive film was measured using a haze meter according to a standard test method of JIS K7105.

TABLE 1

| | Gel % | High temperature & high humidity reliability 85° C., 85% RH | Light transmittance % | Haze |
|---|---|---|---|---|
| Example 1 | 74 | O | 90 | 0.5 |
| Example 2 | 53 | O | 90 | 1.9 |
| Example 3 | 57 | O | 90 | 0.9 |
| Comparative Example 1 | 0 | X | 90 | 0.4 |
| Comparative Example 2 | 0 | X | 90 | 0.4 |
| Comparative Example 3 | 0 | X | 90 | 0.4 |
| Comparative Example 4 | 0 | X | 88 | 9.8 |
| Comparative Example 5 | 0 | X | 89 | 0.5 |

What is claimed is:

1. An encapsulated organic electronic device, comprising:
a substrate;
an organic electronic element formed on the substrate; and
a crosslinked pressure-sensitive adhesive film encapsulating the organic electronic element,
wherein the pressure-sensitive adhesive film comprises a pressure-sensitive adhesive layer including a pressure-sensitive adhesive composition,
wherein the pressure-sensitive adhesive composition comprises:
an encapsulating resin comprising a copolymer of a diene and an olefin-based compound having one carbon-carbon double bond;
a tackifier; and
a multifunctional active energy ray-polymerizable compound satisfying Formula 1 which is included at 5 to 18 parts by weight relative to 100 parts by weight of the encapsulating resin,
wherein the encapsulating resin has a glass transition temperature of less than 0° C., and
wherein the pressure-sensitive adhesive composition has been crosslinked and has a gel content represented by Equation 1 of 50% or more,

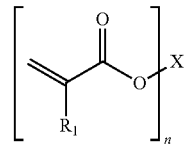

[Formula 1]

wherein $R_1$ is hydrogen or an alkyl group having 1 to 4 carbon atoms, n is an integer of 2 or more, and X is a residue induced from a linear, branched, or cyclic alkyl group having 3 to 30 carbon atoms, Gel content (%)=B/A×100  [Equation 1]

wherein A is a mass of the pressure-sensitive adhesive composition, and B is a dry mass of an insoluble content of the pressure-sensitive adhesive composition remaining after being dipped in toluene at 60° C. for 24 hours and filtered through a 200-mesh filter (pore size of 200 μm).

2. The organic electronic device of claim 1, wherein the pressure-sensitive adhesive composition has a haze of 3% or less while being formed in a film.

3. The organic electronic device of claim 1, wherein the tackifier is a hydrogenated cyclic olefin-based polymer.

4. The organic electronic device of claim 1, wherein, in the pressure-sensitive adhesive composition, the tackifier is included at 5 to 100 parts by weight relative to 100 parts by weight of the encapsulating resin.

5. The organic electronic device of claim 1, wherein the pressure-sensitive adhesive composition further comprises a radical initiator.

6. The organic electronic device of claim 5, wherein, the radical initiator is a photoinitiator or a thermal initiator.

7. The organic electronic device of claim 5, wherein, in the pressure-sensitive adhesive composition, the radical initiator is included at 0.2 to 20 parts by weight relative to 100 parts by weight of the active energy ray-polymerizable compound.

8. The organic electronic device of claim 1, wherein the pressure-sensitive adhesive composition further comprises a moisture absorbent.

9. The organic electronic device of claim 1, wherein the pressure sensitive adhesive film comprises a first layer having the pressure sensitive adhesive layer, and a second layer having a pressure-sensitive adhesive resin or an adhesive resin.

10. The organic electronic device of claim 1, wherein the pressure-sensitive adhesive film has a water vapor transmission rate in a thickness direction of 50 g/m$^2$·day or less when manufactured to have a thickness of 100 μm.

11. The organic electronic device of claim 1, wherein the pressure-sensitive adhesive film has a light transmittance of 90% or more with respect to a visible-ray region.

12. The organic electronic device of claim 1, wherein the pressure-sensitive adhesive film has a haze of 3% or less.

13. A method of manufacturing an encapsulated organic electronic device, comprising:
    providing a substrate;
    forming an organic electronic element on the substrate,
    applying the pressure-sensitive adhesive composition of claim 1 on the substrate to cover the organic electronic element; and
    curing the pressure-sensitive adhesive composition to form a crosslinked pressure-sensitive adhesive film.

* * * * *